United States Patent
Asai et al.

(10) Patent No.: US 10,948,823 B2
(45) Date of Patent: Mar. 16, 2021

(54) LAMINATE AND PATTERN FORMING METHOD

(71) Applicant: Shin-Etsu Chemical Co., Ltd., Tokyo (JP)

(72) Inventors: Satoshi Asai, Annaka (JP); Kyoko Soga, Annaka (JP); Hideto Kato, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 30 days.

(21) Appl. No.: 15/783,397

(22) Filed: Oct. 13, 2017

(65) Prior Publication Data

US 2018/0107116 A1 Apr. 19, 2018

(30) Foreign Application Priority Data

Oct. 14, 2016 (JP) .............................. JP2016-202352

(51) Int. Cl.

| | |
|---|---|
| *G03F 7/075* | (2006.01) |
| *G03F 7/11* | (2006.01) |
| *G03C 11/12* | (2006.01) |
| *C08G 77/38* | (2006.01) |
| *G03F 7/038* | (2006.01) |
| *G03F 7/16* | (2006.01) |
| *G03F 7/20* | (2006.01) |
| *C09D 133/08* | (2006.01) |
| *C09D 133/24* | (2006.01) |
| *C09D 163/00* | (2006.01) |
| *C09D 167/00* | (2006.01) |
| *C09D 175/04* | (2006.01) |
| *C09D 183/04* | (2006.01) |

(52) U.S. Cl.
CPC ........... *G03F 7/0757* (2013.01); *C08G 77/38* (2013.01); *G03F 7/0382* (2013.01); *G03F 7/11* (2013.01); *G03F 7/161* (2013.01); *G03F 7/2002* (2013.01); *C09D 133/08* (2013.01); *C09D 133/24* (2013.01); *C09D 163/00* (2013.01); *C09D 167/00* (2013.01); *C09D 175/04* (2013.01); *C09D 183/04* (2013.01)

(58) Field of Classification Search
CPC .......... G03F 7/0757; G03F 7/11; G03C 11/12
USPC .............................. 430/273.1, 260, 261, 262
See application file for complete search history.

(56) References Cited

U.S. PATENT DOCUMENTS

| | | | | |
|---|---|---|---|---|
| 8,481,244 B2* | 7/2013 | Takeda | ..................... | C08L 83/06 430/18 |
| 8,921,031 B2* | 12/2014 | Bae | ..................... | H01L 21/3081 430/270.1 |
| 9,012,111 B2* | 4/2015 | Asai | ..................... | G03F 7/0041 430/18 |
| 10,416,559 B2* | 9/2019 | Asai | ..................... | G03F 7/0382 |
| 2011/0076465 A1* | 3/2011 | Takeda | ..................... | C08L 83/06 428/195.1 |
| 2013/0149645 A1* | 6/2013 | Takemura | ............. | G03F 7/0757 430/280.1 |
| 2013/0244438 A1* | 9/2013 | Bae | ..................... | H01L 21/3081 438/703 |
| 2013/0323631 A1* | 12/2013 | Asai | ..................... | G03F 7/0382 430/18 |
| 2016/0097973 A1* | 4/2016 | Urano | .................. | C09D 183/14 428/138 |
| 2016/0200877 A1* | 7/2016 | Urano | .................. | C09D 183/14 428/138 |
| 2016/0223905 A1* | 8/2016 | Ou | ......................... | G03F 7/0045 |
| 2018/0107115 A1* | 4/2018 | Asai | ..................... | G03F 7/038 |

FOREIGN PATENT DOCUMENTS

| | | |
|---|---|---|
| EP | 2305754 A1 | 4/2011 |
| EP | 3002308 A1 | 4/2016 |
| EP | 3002633 A1 | 4/2016 |
| JP | 2001-33984 A | 2/2001 |
| JP | 2011-94115 A | 5/2011 |

OTHER PUBLICATIONS

Extended European Search Report dated Feb. 23, 2018, issued in counterpart European Application No. 17196374.7. (7 pages).

* cited by examiner

*Primary Examiner* — John S Chu

(74) *Attorney, Agent, or Firm* — Westerman, Hattori, Daniels & Adrian, LLP

(57) ABSTRACT

To provide a laminate which enables pattern formation with excellent opening shape even in the case where a chemically amplified negative type resist material is used, and a pattern forming method in which the laminate is used.

The laminate includes a chemically amplified negative type resist layer, and a basic resin coat layer thereon that contains 0.001 to 10% by weight of a basic compound having a molecular weight of up to 10,000.

7 Claims, No Drawings

LAMINATE AND PATTERN FORMING METHOD

CROSS-REFERENCE TO RELATED APPLICATION

This non-provisional application claims priority under 35 U.S.C. § 119(a) on Patent Application No. 2016-202352 filed in Japan on Oct. 14, 2016, the entire contents of which are hereby incorporated by reference.

TECHNICAL FIELD

The present invention relates to a laminate provided with a basic resin coat layer on a chemically amplified negative type resist layer, and a pattern forming method in which the laminate is used.

BACKGROUND ART

Attendant on the trend toward smaller size and higher functionality in various electronic apparatuses such as personal computers, digital cameras, and mobile phones, there has been a rapidly increasing demand for further smaller size, smaller thickness, and higher density in regard of semiconductor devices. Accordingly, it is desired to develop a photosensitive insulating material which makes it possible to cope with an increase in substrate area for enhanced productivity and also to cope with a structure having fine ruggedness (fine projections and recesses) with a high aspect ratio on a substrate, in high-density mounting technologies such as chip size packaging or chip scale packaging (CSP) and three-dimensional lamination.

Furthermore, in recent years, in the high density mounting technologies such as chip size packaging or chip scale packaging (CSP) and three-dimensional lamination, a technology has been used vigorously in which a fine pattern with a high aspect ratio is formed on a substrate, and a metal such as copper is stacked on the thus obtained pattern to thereby achieve rewiring from the chip. Attendant on the tendency toward higher density and higher integration of chips, there is an extremely keen demand for a finer pattern line width and a finer contact hole size in connection between substrates in the rewiring technology. As a method for obtaining a fine pattern, lithographic techniques are generally used, and, among others, a chemically amplified negative type resist material is suitable for obtaining a fine pattern. In addition, the pattern used for the rewiring is permanently left in and between the device chips, and is required to have a curability and also serve as an electric/electronic part-protecting film excellent in flexibility, heat resistance, electric properties, adhesion, reliability, and chemical resistance. For this reason, a negative type resist material is thought to be suitable for obtaining such a pattern.

Therefore, a chemically amplified negative type resist material can be suitably used as a pattern forming material permitting fine rewiring, for forming an electric/electronic part-protective film excellent in flexibility, heat resistance, electric properties, adhesion, reliability, and chemical resistance.

On the other hand, in regard of the negative type resist material used in recent years, development of a material is demanded in which the shape of openings for processing fine rewiring is controlled. Since the exposure value at the time of pattern formation increases as the film thickness increases, the efficiency of acid generation of a photo acid generator at a light-exposed surface becomes relatively higher than that at a light exposure bottom portion, so that the shape of openings at the pattern surface portion is liable to be a T-top shape. When the T-top shape is present, it causes a trouble such as defects upon formation of a film coat in the subsequent rewiring process or generation of pattern cracking in various environmental load tests. As a cause of formation of the T-top shape, in the case where a chemically amplified negative type resist material is used, there may be mentioned the formation of a pattern by crosslinking with an acid generated upon light exposure. Therefore, this problem can be solved if an appropriate amount of a basic component is present in the surface layer at the time of pattern formation. However, even if a basic compound can be made present together with other components in a composition, it is impossible to cause the basic compound to be unevenly distributed predominantly in the surface layer. Accordingly, it is difficult to solve the problem by this approach.

CITATION LIST

Patent Document 1: JP-A 2011-094115

SUMMARY OF INVENTION

An object of the present invention is to provide a laminate which enables pattern formation with excellent opening shape even in the case where a chemically amplified negative type resist material is used, and a pattern forming method in which the laminate is used.

In the process of reaching the present invention, it has been found out that when a laminate provided with a basic resin coat layer containing a basic compound on a chemically amplified negative type resist layer is used, the shape of openings in a pattern can be greatly improved. The present invention is based on the finding.

Thus, the present invention provides the following laminate and pattern forming method.

In an aspect of the present invention, there is provided a laminate including a chemically amplified negative type resist layer, and a basic resin coat layer on the chemically amplified negative type resist layer that contains 0.001 to 10% by weight of a basic compound having a molecular weight of up to 10,000.

In the laminate as above, preferably, the resin coat layer is transmissive to light having a wavelength of 190 to 500 nm.

In the laminate as above, preferably, the resin coat layer contains at least one resin selected from among epoxy resins, phenolic resins, acrylic resins, silicone resins, polyester resins, polyurethane resins, and polyimide resins.

In the laminate as above, the chemically amplified negative type resist layer may contain:

(A) a siloxane skeleton-containing polymer compound having a weight average molecular weight of 3,000 to 500,000 and represented by the following formula (1):

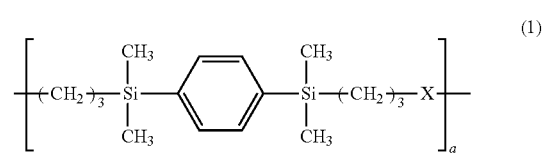

-continued

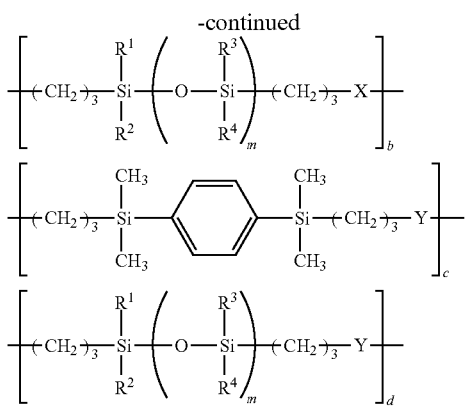

wherein R¹ to R⁴ are each independently a monovalent hydrocarbon group having 1 to 8 carbon atoms, m is an integer of 1 to 100, a, b, c, and d are numbers satisfying $0 \leq a \leq 1$, $0 \leq b \leq 1$, $0 \leq c \leq 1$, $0 \leq d \leq 1$, $0 < a+b \leq 1$, and $a+b+c+d=1$, X is a divalent organic group represented by the following formula (2), Y is a divalent organic group represented by the following formula (3):

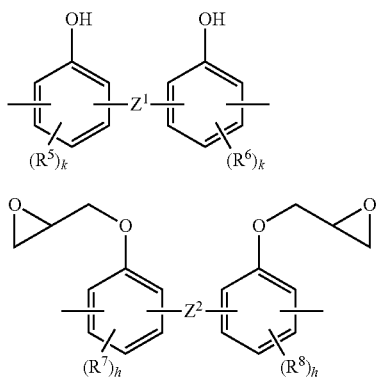

wherein $Z^1$ and $Z^2$ are each independently a single bond or a divalent organic group selected from among the following,

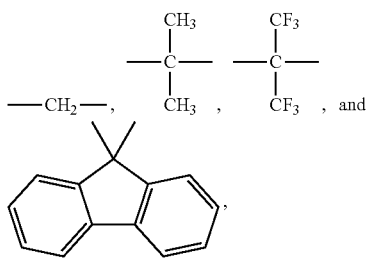

R⁵ to R⁸ are each independently an alkyl group or alkoxyl group having 1 to 4 carbon atoms, and k and h are each independently 0, 1 or 2;

(B) a polyhydric phenol compound containing at least three hydroxyl groups;

(C) a photo acid generator that generates an acid by being decomposed by light having a wavelength of 190 to 500 nm; and (D) at least one crosslinking agent selected from among an amino condensate modified with formaldehyde or form-aldehyde-alcohol, a phenol compound containing an average of at least two methylol groups or alkoxymethylol groups in one molecule thereof, and a compound obtained by substituting a hydroxyl group of a polyhydric phenol with a glycidoxyl group.

In the laminate as above, the chemically amplified negative type resist layer may be formed using a composition containing:

(A) a siloxane skeleton-containing polymer compound having a weight average molecular weight of 3,000 to 500,000 and represented by the following formula (1):

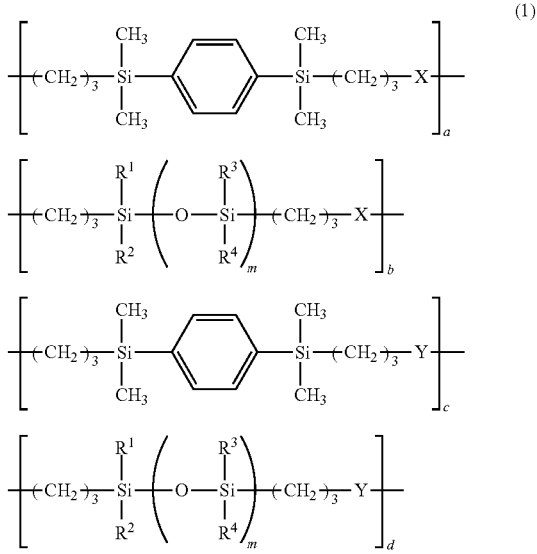

wherein R¹ to R⁴ are each independently a monovalent hydrocarbon group having 1 to 8 carbon atoms, m is an integer of 1 to 100, a, b, c, and d are numbers satisfying $0 \leq a \leq 1$, $0 \leq b \leq 1$, $0 \leq c \leq 1$, $0 \leq d \leq 1$, $0 < a+b \leq 1$, and $a+b+c+d=1$, X is a divalent organic group represented by the following formula (2), Y is a divalent organic group represented by the following formula (3):

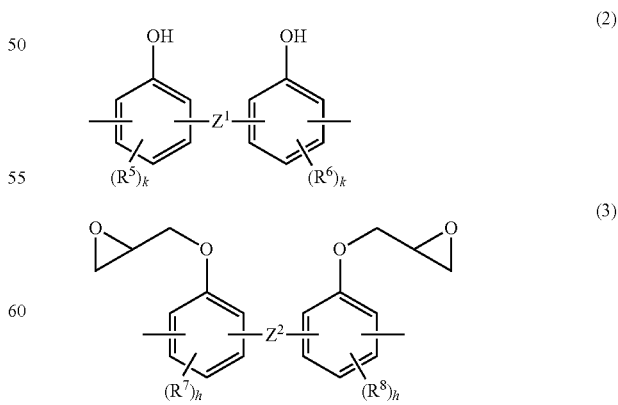

wherein $Z^1$ and $Z^2$ are each independently a single bond or a divalent organic group selected from among the following,

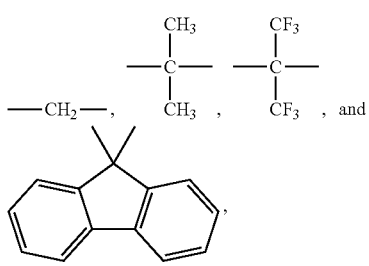

$R^5$ to $R^8$ are each independently an alkyl group or alkoxyl group having 1 to 4 carbon atoms, and k and h are each independently 0, 1 or 2;

(B) a polyhydric phenol compound containing at least three hydroxyl groups;

(C) a photo acid generator that generates an acid by being decomposed by light having a wavelength of 190 to 500 nm;

(D) at least one crosslinking agent selected from among an amino condensate modified with formaldehyde or formaldehyde-alcohol, a phenol compound containing an average of at least two methylol groups or alkoxymethylol groups in one molecule thereof, and a compound obtained by substituting a hydroxyl group of a polyhydric phenol with a glycidoxyl group; and (G) a solvent.

In another aspect of the present invention, there is provided a pattern forming method including the steps of: performing exposure by irradiating the chemically amplified negative type resist layer of the laminate as above with light; developing the exposed resist layer; and heating the developed resist layer.

In the pattern forming method as above, preferably, a side wall angle of a pattern is 60 to 90 degrees.

Advantageous Effects of Invention

According to the present invention, a pattern forming method excellent in pattern shape of openings in a pattern of a chemically amplified negative type resist material can be provided, and it is possible to form a fine pattern using light in a wide wavelength range, and to achieve formation of a finer pattern in rewiring technology practiced attendant on the trend toward higher density and higher integration of chips.

DESCRIPTION OF PREFERRED EMBODIMENTS

Laminate

A laminate according to the present invention includes a chemically amplified negative type resist layer, and a basic resin coat layer thereon that contains 0.001 to 10% by weight of a basic compound having a molecular weight of up to 10,000.

Basic Resin Coat Layer

Examples of the basic compound having a molecular weight of up to 10,000 include primary, secondary and tertiary aliphatic amines, mixed amines, aromatic amines, heterocyclic amines, nitrogen-containing compounds having a carboxyl group, nitrogen-containing compounds having a sulfonyl group, nitrogen-containing compounds having a hydroxyl group, nitrogen-containing compounds having a hydroxyphenyl group, alcoholic nitrogen-containing compounds, amide derivatives, and imide derivatives. The lower limit on the molecular weight of the basic compound is preferably 15, more preferably 100. The upper limit on the molecular weight of the basic compound is preferably 2,000, more preferably 1,500.

Examples of the primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine.

Examples of the secondary aliphatic amines include dimethlamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine.

Examples of the tertiary aliphatic amines include trimethylamine, triethylamine, tri-n-propylamine, triisopropylamine, tri-n-butylamine, triisobutylamine, tri-sec-butylamine, tripentylamine, triethanolamine, tert-butyldiethanolamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of the mixed amines include dimethylethylamine, methylethylpropylamine, benzylamine, phenethylamine, and benzyldimethylamine.

Examples of the aromatic amines and heterocyclic amines include aniline derivatives (for example, aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, or N,N-dimethyltoluidine), diphenyl(p-tolyl)amine, methyldiphenylamine, triphenylamine, phenylenediamine, naphthylamine, diaminonaphthalene, pyrrole derivatives (for example, pyrrole, 2H-pyrrole, 1-methylpyrrole, 2,4-dimethylpyrrole, 2,5-dimethylpyrrole, or N-methylpyrrole), oxazole derivatives (for example, oxazole or isoxazole), thiazole derivatives (for example, thiazole or isothiazole), imidazole derivatives (for example, imidazole, 4-methylimidazole, or 4-methyl-2-phenylimidazole), pyrazole derivatives, furazan derivatives, pyrroline derivatives (for example, pyrroline or 2-methyl-1-pyrroline), pyrrolidine derivatives (for example, pyrrolidine, N-methylpyrrolidine, pyrrolidinone, or N-methylpyrrolidone), imidazoline derivatives, imidazolidine derivatives, pyridine derivatives (for example, pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, or dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (for example, quinolone or 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of the nitrogen-containing compounds having a carboxyl group include aminobenzoic acid, indolecarboxylic acid, and amino acid derivatives (for example, nicotinic acid, alanine, arginine, aspartic acid, glutamic acid, glycine, histidine, isoleucine, glycylleucine, leucine, methionine, phenylalanine, threonine, lysine, 3-aminopyrazine-2-carboxylic acid, or methoxyalanine).

Examples of the nitrogen-containing compounds having a sulfonyl group include 3-pyridinesulfonic acid and pyridinium p-toluenesulfonate.

Examples of the nitrogen-containing compounds having a hydroxyl group, the nitrogen-containing compounds having a hydroxyphenyl group, and the alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidineethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidineethanol, 1-aziridineethanol, N-(2-hydroxyethyl)phthalimide, and N-(2-hydroxyethyl)isonicotinamide.

Examples of the amide derivatives include formamide, N-methylformamide, N,N-dimethylformamide, acetamide, N-methylacetamide, N,N-dimethylacetamide, propionamide, and benzamide.

Examples of the imide derivatives include phthalimide, succinimide, and maleimide.

Besides, basic compounds represented by the following formula (5) can also be used preferably.

$$(R^{11})_p-N-(R^{12})_{3-p} \quad (5)$$

In the formula (5), p is 1, 2 or 3. $R^{11}$ is a substituent group selected from substituent groups represented by the following formulas (6) to (8). $R^{12}$ is a hydrogen atom, or a straight, branched, or cyclic alkyl group having 1 to 20 carbon atoms which may contain an ether bond or a hydroxyl group. In addition, when at least two $R^{11}$ groups are present, two $R^{11}$ groups may be bonded to each other to form a ring together with the nitrogen atom to which they are bonded. When at least two $R^{11}$ groups are present, they may be identical or different. When at least two $R^{12}$ groups are present, they may be identical or different.

$$-R^{101}-O-R^{102} \quad (6)$$

$$-R^{103}-O-R^{104}-\overset{\overset{\displaystyle O}{\|}}{C}-R^{105} \quad (7)$$

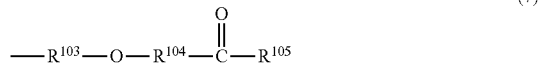

$$-R^{106}-\overset{\overset{\displaystyle O}{\|}}{C}-O-R^{107} \quad (8)$$

In the formulas (6) to (8), $R^{101}$, $R^{103}$, and $R^{106}$ are each independently a straight or branched alkylene group having 1 to 4 carbon atoms. $R^{102}$ and $R^{105}$ are each independently a hydrogen atom, or a straight, branched, or cyclic alkyl group having 1 to 20 carbon atoms which may contain at least one selected from among a hydroxy group, an ether bond, an ester bond, and a lactone ring. $R^{104}$ is a single bond, or a straight or branched alkylene group having 1 to 4 carbon atoms. $R^{107}$ is a straight, branched, or cyclic alkyl group having 1 to 20 carbon atoms which may contain at least one selected from among a hydroxyl group, an ether bond, an ester bond, and a lactone ring.

Examples of the compounds represented by the formula (5) include, but are not limited to, tris[2-(methoxymethoxy)ethyl]amine, tris[2-(2-methoxyethoxy)ethyl]amine, tris[2-(2-methoxyethoxymethoxy)ethyl]amine, tris[2-(1-methoxyethoxy)ethyl]amine, tris[2-(1-ethoxyethoxy)ethyl]amine, tris[2-(1-ethoxypropoxy)ethyl]amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hyroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-aetoxyethyl)-2-(2-acetoxyethoxycarbonyl)ethylamine, N,N-bis(2-hydroxyethyl)-2-[(methoxycarbonyl)methoxycarbonyl]ethylamine, N,N-bis(2-acetoxyethyl)-2-[(methoxycarbonyl)methoxycarbonyl]ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)bis[2-(methoxycarbonyl)ethyl]amine, N-(2-acetoxyethyl)bis[2-(methoxycarbonyl)ethyl]amine, N-(2-hydroxyethyl)bis[2-

(ethoxycarbonyl)ethyl]amine, N-(2-acetoxyethyl)bis[2-(ethoxycarbonyl)ethyl]amine, N-(3-hydroxy-1-propyl)bis[2-(methoxycarbonyl)ethyl]amine, N-(3-acetoxy-1-propyl)bis[2-(methoxycarbonyl)ethyl]amine, N-(2-methoxyethyl)bis[2-(methoxycarbonyl)ethyl]amine, N-butylbis[2-(methoxycarbonyl)ethyl]amine, N-butylbis[2-(2-methoxyethoxycarbonyl)ethyl]amine, N-methylbis(2-acetoxyethyl)amine, N-ethylbis(2-acetoxyethyl)amine, N-methylbis(2-pivaloyloxyethyl)amine, N-ethylbis[2-(methoxycarbonyloxy)ethyl]amine, N-ethylbis[2-(tert-butoxycarbonyloxy)ethyl]amine, tris(methoxycarbonylmethyl)amine, tris(ethoxycarbonylmethyl)amine, N-butylbis(methoxycarbonylmethyl)amine, N-hexylbis(methoxycarbonylmethyl)amine, and β-(diethylamino)-δ-valerolactone.

From the viewpoint of sensitivity, the content of the basic compound is 0.001 to 10% by weight, preferably 0.003 to 5% by weight in the resin layer. If the content of the basic compound is too high, the resolution of the chemically amplified negative type resist layer formed as a lower layer would be worsened, and the pattern at the surface of an exposed portion may be deteriorated. If the content of the basic compound is too low, on the other hand, the pattern may have a T-top shape. The basic compounds may be used either singly or in combination of at least two of them.

The resin contained in the basic resin coat layer is not particularly limited so long as the resin is compatible with the basic compound, and preferable examples thereof include epoxy resins, phenolic resins, acrylic resins, silicone resins, polyester resins, polyurethane resins, and polyimide resins. Among them, preferred are silicone resins, and particularly preferred are siloxane skeleton-containing polymer compounds represented by the formula (1) which are used for the chemically amplified negative type resist layer described later.

The basic resin coat layer is preferably transmissive to light having a wavelength of 190 to 500 nm. Specifically, the basic resin coat layer preferably has a transmittance of at least 60% for light having a wavelength of 190 to 500 nm. When the light transmittance is in this range, favorable pattern formation is possible. Note that the light transmittance can be measured by a hazemeter.

The basic resin coat layer may contain an organic solvent, as required. The organic solvent may be a known solvent, examples of which include: ketones such as cyclohexanone, cyclopentanone, and methyl 2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionte, tert-butyl acetate, tert-butyl propionate, propylene glycol mono-tert-butyl ether acetate, and γ-butyrolactone. These may be used either singly or as a mixture of at least two of them. The content of the organic solvent is preferably 0 to 30 parts by weight, more preferably 0 to 15 parts by weight, per 100 parts by weight in total of the basic compound and the resin.

The thickness of the basic resin coat layer is preferably 1 to 100 μm, more preferably 5 to 50 μm, and further preferably 10 to 30 μm. When the thickness of the basic resin coat layer is in this range, favorable resist pattern formation is possible.

Note that in the present invention, it is further preferable that an acid concentration gradient is present, from the boundary layer between the resist application layer and the resin coat layer containing the basic compound toward the resist application layer, at the time of pattern formation.

Chemically Amplified Negative Type Resist Layer

The chemically amplified negative type resist layer is preferably one that contains a siloxane skeleton-containing resin having a weight average molecular weight (Mw) of 3,000 to 500,000, particularly preferably one that contains:

(A) a siloxane skeleton-containing polymer compound having an Mw of 3,000 to 500,000 and represented by the following formula (1):

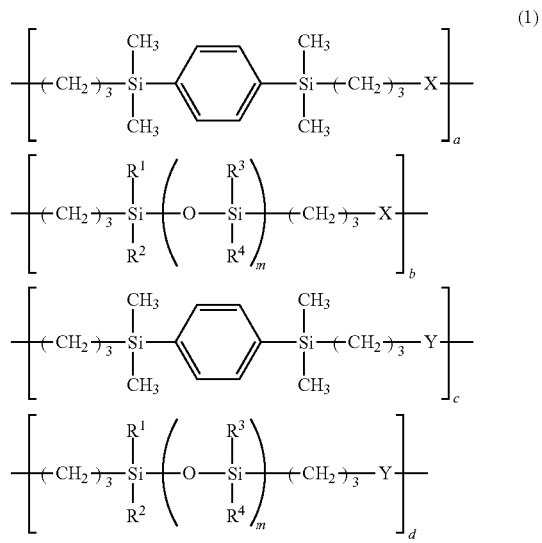

wherein $R^1$ to $R^4$ are each independently a monovalent hydrocarbon group having 1 to 8 carbon atoms, m is an integer of 1 to 100, a, b, c, and d are numbers satisfying $0 \le a \le 1$, $0 \le b \le 1$, $0 \le c \le 1$, $0 \le d \le 1$, $0 < a+b \le 1$, and $a+b+c+d=1$, X is a divalent organic group represented by the following formula (2), Y is a divalent organic group represented by the following formula (3):

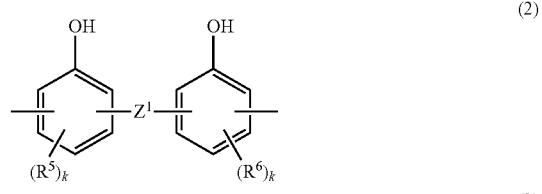

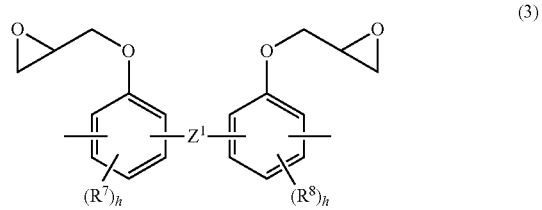

wherein $Z^1$ and $Z^2$ are each independently a single bond or a divalent organic group selected from among the following,

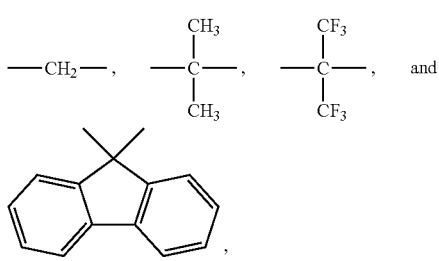

$R^5$ to $R^8$ are each independently an alkyl group or alkoxyl group having 1 to 4 carbon atoms, and k and h are each independently 0, 1 or 2;

(B) a polyhydric phenol compound containing at least three hydroxyl groups;

(C) a photo acid generator that generates an acid by being decomposed by light having a wavelength of 190 to 500 nm; and (D) at least one crosslinking agent selected from among an amino condensate modified with formaldehyde or formaldehyde-alcohol, a phenol compound containing an average of at least two methylol groups or alkoxymethylol groups in one molecule thereof, and a compound obtained by substituting a hydroxyl group of a polyhydric phenol with a glycidoxyl group.

In the formula (1), examples of the monovalent hydrocarbon group include alkyl groups such as methyl and ethyl, and aryl groups such as phenyl. In addition, a, b, c, and d preferably satisfy $0.05 \leq a \leq 0.9$, $0.05 \leq b \leq 0.9$, $0 < c \leq 0.7$, and $0 < d \leq 0.7$.

The Mw of the siloxane skeleton-containing resin of the component (A) is more preferably 3,000 to 500,000, and further preferably 5,000 to 200,000. The siloxane skeleton-containing resins of the component (A) may be used either singly or in combination of at least two of them.

Examples of the polyhydric phenol compound containing at least three hydroxyl groups of the component (B) include resol-type phenolic resins, novolac-type phenolic resins and the like prepared by use of phenol, alkyl phenols such as bisphenol A, p-tert-butylphenol, octylphenol, or p-cumylphenol, p-phenylphenol, or cresol as a raw material. These may be used either singly or in combination of at least two of them.

The content of the component (B) is preferably 0.5 to 50 parts by weight, more preferably 1 to 30 parts by weight, per 100 parts by weight of the component (A).

The photo acid generator of the component (C) is not particularly limited so long as it generates an acid by being decomposed by irradiation with light having a wavelength of 190 to 500 nm. Examples of such a photo acid generator include onium salts, diazomethane derivatives, glyoxime derivatives, β-ketosulfon derivatives, disulfon derivatives, nitrobenzyl sulfonate derivatives, sulfonic acid ester derivatives, imidoyl sulfonate derivatives, oxime sulfonate derivatives, imino sulfonate derivatives, and triazine derivatives. These may be used either singly or in combination of at least two of them.

The content of the component (C) is preferably 0.05 to 20 parts by weight, more preferably 0.2 to 5 parts by weight, per 100 parts by weight of the component (A).

Examples of the amino condensate modified with formaldehyde or formaldehyde-alcohol, among the crosslinking agents of the component (D), include melamine condensates modified with formaldehyde or formaldehyde-alcohol, and urea condensates modified with formaldehyde or formaldehyde-alcohol. Examples of the phenol compound having an average of at least two methylol groups or alkoxymethylol groups in one molecule thereof, among the crosslinking agents of the component (D), include (2-hydroxy-5-methyl)-1,3-benzenedimethanol and 2,2',6,6'-tetramethoxymethyl-bisphenol A. These compounds may be used either singly or in combination of at least two of them.

The content of the component (D) is preferably 0 to 50 parts by weight, and, when used, preferably 1 to 30 parts by weight, per 100 parts by weight of the component (A).

In addition, the chemically amplified negative type resist layer may contain a curing accelerator as a component (E). In the case where the siloxane skeleton-containing polymer compound has an epoxy group, the curing accelerator (E) is a compound having a function of accelerating the curing rate when the polymer compound cures. Examples of the curing accelerator include tertiary amines or salts thereof, and imidazoles. These may be used either singly or in combination of at least two of them.

The content of the component (E) is preferably 0 to 3 parts by weight, more preferably 0 to 1 part by weight, per 100 parts by weight of the component (A).

Furthermore, the chemically amplified negative type resist layer may contain a basic compound as a component (F). As the basic compound (F), basic compounds which are used for the film material is preferable. These basic compounds may be used either singly or in combination of at least two of them.

The content of the component (F) is preferably 0 to 5 parts by weight, more preferably 0.01 to 3 parts by weight, per 100 parts by weight of the component (A).

The chemically amplified negative type resist layer may be formed by laminating a dry film including the components (A) to (D) and optionally the components (E) and (F), on a wafer. The chemically amplified negative type resist layer may be formed by use of a chemically amplified negative type resist composition which contains the components (A) to (D) and optionally the components (E) and (F) and a solvent (G).

The solvent of the component (G) is not specifically restricted so long as it can dissolve the components (A) to (D). Examples of such a solvent include: ketones such as cyclohexane, cyclopentane, and methyl 2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and γ-butyrolactone. These may be used either singly or as a mixture of at least two of them.

From the viewpoint of compatibility of the resist material, viscosity, and application properties, the content of the solvent of the component (G) is preferably 50 to 2,000 parts by weight, more preferably 100 to 1,000 parts by weight, per 100 parts by weight in total of the components (A) to (D).

The laminate of the present invention can be produced by a method in which the basic resin coat layer forming composition containing the basic compound, the resin and the solvent is applied to the chemically amplified negative type resist film to form a coat, or a method in which the basic resin coat including the basic compound and the resin is laminated on the chemically amplified negative type resist film. Note that the basic resin coat layer forming composition preferably contains an organic solvent in an amount of 0.1 to 1,000 parts by weight, more preferably 0.1 to 30 parts by weight, per 100 parts by weight in total of the basic compound and the resin.

The former producing method may be, for example, a method as follows. When a support film let off from a letting-off shaft of a film coater is passed through a coater head of the film coater, a chemically amplified negative type resist material is applied to the support film in a predetermined thickness, and the resist material-coated support film is passed through a hot air circulation oven at a predetermined temperature and over a predetermined time to dry the resist material on the support film. Further, a basic resin coat layer forming composition is applied to the resist-coated support film in a predetermined thickness, and the thus coated support film is passed through a hot air circulation oven at a predetermined temperature and over a predetermined time to dry the composition on the support film, thereby forming a laminate. The laminate, together with a protective film let off from another letting-off shaft of the film coater, is passed through laminating rolls under a predetermined pressure, for lamination with the resin layer on the support film, and the resulting laminate is taken up onto a take-up shaft of the film coater. Note that the order of the applicating steps may be reversed.

In this case, the temperature of the hot air circulation oven is preferably 25° C. to 150° C., the passing time through the oven is preferably one to 100 minutes, and the pressure of the laminating roll is preferably 0.01 to 5 MPa.

The support film may be a monolayer film, or may be a multilayer film in which a plurality of films are laminated. Examples of the material of the support film include synthetic resins such as polyethylene, polypropylene, polycarbonate, and polyethylene terephthalate. Among these, polyethylene terephthalate is preferred from the viewpoint of light transmittance, appropriate flexibility, mechanical strength, and heat resistance. Besides, these films may be ones having undergone a corona treatment or coating with a release agent. These may be commercialized ones, examples of which include Cerapeel WZ(RX) and Cerapeel BX8(R) (made by Toray Advanced Film Co., Ltd.), E7302 and E7304 (made by Toyobo Co., Ltd.), Purex G31 and Purex G71T1 (made by Teijin DuPont Films Japan Limited), and PET38×1-A3, PET38×1-V8, and PET38×1-X08 (made by Nippa Corporation). Note that the thickness of the support film is preferably 5 to 150 μm, more preferably 10 to 100 μm.

The latter producing method may be, for example, a method in which a resist film material having a chemically amplified negative type resist layer and a protective film formed on a support film and a film material having a basic resin coat layer and a protective film formed on a support film are individually produced in the same manner as above-mentioned, and, thereafter, the protective films are peeled off and the support films with the respective layers thereon are press bonded by a roll-to-roll film laminator. In this case, the roll temperature is preferably 10° C. to 120° C., and the pressure of the laminating roll is preferably 0 to 5.0 MPa.

An apparatus for laminating the laminate on a substrate is preferably a vacuum laminator. The laminate is mounted to a film laminating apparatus, and the chemically amplified negative type resist layer exposed by releasing the protective film is pressed against the substrate on a table at a predetermined temperature in a vacuum chamber kept at a predetermined degree of vacuum, by use of a laminating roll at a predetermined pressure. Note that the temperature of the table is preferably 60° C. to 120° C., the pressure of the laminating roll is preferably 0 to 5.0 MPa, and the degree of vacuum in the vacuum chamber is preferably 50 to 500 Pa. With vacuum lamination thus conducted, no void or gap is generated between the laminate and the substrate, which is preferable.

Pattern Forming Method

A pattern forming method of the present invention includes the steps of irradiating a resist film of a laminate with light to expose the resist film, developing the exposed resist film, and heating the developed resist film.

The laminate having the basic resin film coat layer formed on the chemically amplified negative type resist layer is subjected to patterning by lithography through a mask. In this patterning, exposure is conducted, a post-exposure heat treatment (post-exposure baking (PEB)) is conducted, development is conducted, and, further, post-curing is conducted, if necessary, whereby the pattern is formed. In other words, the pattern formation can be carried out using a known lithographic technique.

Prior to the exposure, preliminary heating (prebaking) may be performed, if necessary, for the purpose of enhancing flatness of the laminate or diffusing the basic compound in the film. The prebaking may be conducted, for example, at 40° C. to 140° C. for approximately one minute to one hour.

Next, exposure to light having a wavelength of 190 to 500 nm is conducted through a photomask, to effect curing. The photomask may be, for example, one in which a desired pattern is cut out. Note that a material that shields the light having a wavelength of 190 to 500 nm is preferably used as the material of the photomask, and, specifically, chromium or the like is preferably used, but this is not restrictive.

Examples of the light having a wavelength of 190 to 500 nm include lights having various wavelengths generated by a radiation generator, specifically, ultraviolet radiation such as g-line and i-line, and far ultraviolet radiation (248 nm, 193 nm). The wavelength of the light is preferably 300 to 450 nm. The exposure value is preferably 10 to 3,000 mJ/cm$^2$. With exposure conducted in this way, the exposed portions are crosslinked, to form a pattern insoluble in a developer which will be described later.

Further, the PEB is conducted for enhancing development sensitivity. The PEB may be performed, for example, at 40° C. to 140° C. for five to ten minutes.

Thereafter, development with a developer is conducted. Preferable examples of the developer include organic solvents such as 2-propanol (IPA) and propylene glycol monomethyl ether acetate (PGMEA). Besides, preferred examples of an alkaline developer include 2.38% by weight aqueous solution of tetramethylhydroxyammonium. In the pattern forming method of the present invention, an organic solvent is preferably used as the developer. In this case, the basic resin coat layer for correcting the pattern shape is not cured, and, hence, is removed.

The development may be carried out by an ordinary method, for example, by immersing the substrate formed with the pattern in the developer. Thereafter, if necessary, cleaning, rinsing, drying and the like are conducted, whereby a chemically amplified negative type resist layer having the desired pattern is obtained.

Furthermore, baking is conducted after the development, whereby the pattern obtained by the patterning of the chemically amplified negative type resist layer is cured. The pattern obtained by the patterning of the chemically amplified negative type resist layer is baked using an oven or a hot plate at a temperature of preferably 100° C. to 250° C., more preferably 150° C. to 220° C., further preferably 170° C. to 190° C., to effect curing (post-curing). When the post-curing temperature is 100° C. to 250° C., the crosslink density of the chemically amplified negative type resist layer can be enhanced, and the residual volatile components can be removed, which is preferred from the viewpoint of adhesion to the substrate, heat resistance, strength and, further, electrical properties. The post-curing time may be ten minutes to ten hours.

The pattern thus obtained has a side wall angle of preferably 60 to 90 degrees, more preferably 80 to 90 degrees. Note that the side wall angle is that angle formed between the substrate and a side wall of the resist film which is on the side where the resist film is present.

EXAMPLES

The present invention will be described specifically below by depicting Synthesis Examples, Preparation Examples, Examples, and Comparative Examples, but the present invention is not limited to the following Examples. Note that in the following Examples, the weight average molecular weight (Mw) is a measured value in terms of polystyrene obtained by GPC using tetrahydrofuran as a solvent. In addition, structural formulas of compounds (M-1) to (M-7) used in the following Synthesis Examples are depicted below.

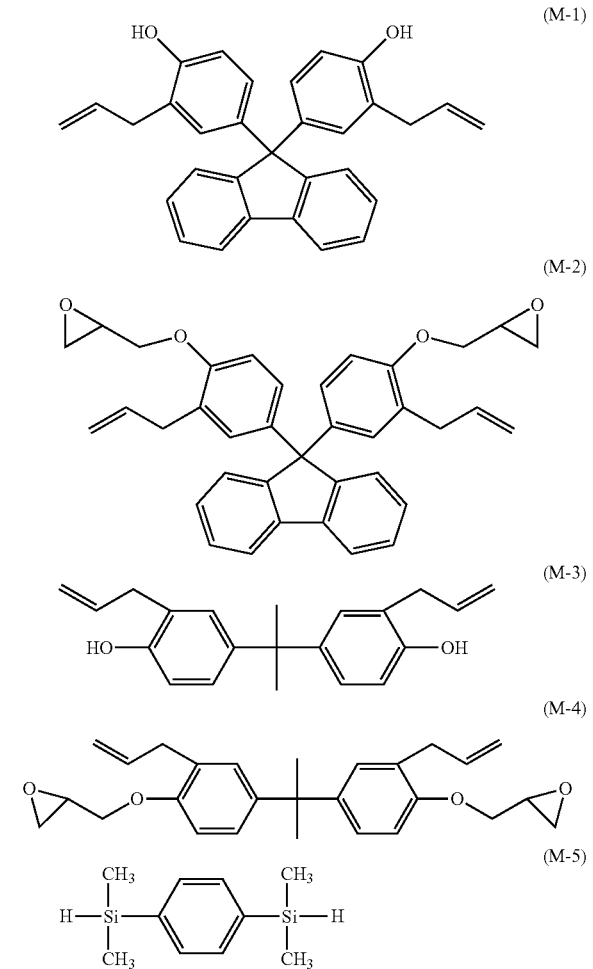

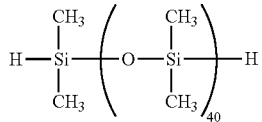

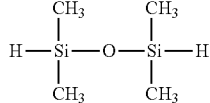

Synthesis Example 1

In a 5 L flask equipped with a stirrer, a thermometer, a nitrogen purge system, and a reflux condenser, 1,875 g of toluene was placed, then 405.0 g of a compound (M-1) and 40.0 g of a compound (M-4) were added thereto and dissolved therein, and further 949.6 g of a compound (M-6) and 6.1 g of a compound (M-7) were added, followed by heating to 60° C. Thereafter, 2.2 g of a carbon-supported platinum catalyst (5% by weight) was put into the flask. After it was confirmed that the internal reaction temperature rose to 65° C. to 67° C., the contents of the flask was aged further at 90° C. over three hours, was then cooled to 60° C., 2.2 g of the carbon-supported platinum catalyst (5% by weight) was added thereto, and 107.5 g of a compound (M-5) was added dropwise to the flask over one hour. In this instance, the temperature inside the flask rose to 78° C. After the dropwise addition was over, the contents of the flask was aged further at 90° C. for 1.5 hours, was cooled to room temperature, 1,700 g of methyl isobutyl ketone was added thereto, and the reaction solution was filtered under pressure to remove the platinum catalyst. Further, 760 g of pure water was added to the thus obtained solution, followed by stirring, leaving to stand, and liquid separation, to remove an aqueous layer of a lower layer. The liquid-separating and water-washing operation was repeated six times, to remove trace of acid component in the solution. The solvents in the solution were distilled off under reduced pressure, and 950 g of cyclopentanone was added, to obtain a solution of a polymer compound (A-1) having a solid concentration of 60% by weight and containing cyclopentanone as a main solvent. The polymer compound (A-1) had the structure of the following formula, and its Mw was 31,000. Note that the compositional ratios of the repeating units were calculated based on the material amounts of the starting compounds. Besides, m in the following formula is 1 or 40.

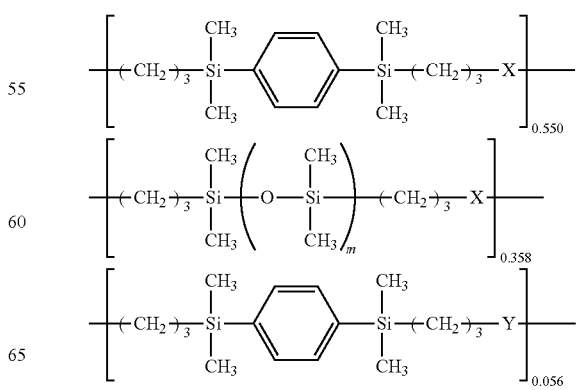

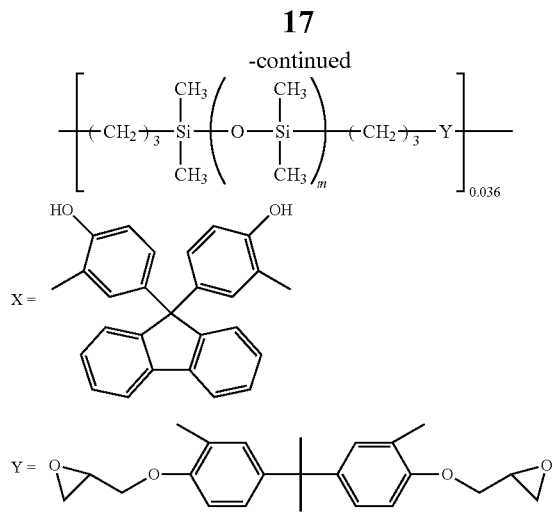

Synthesis Example 2

In a 5 L flask equipped with a stirrer, a thermometer, a nitrogen purge system, and a reflux condenser, 2,000 g of toluene was placed, then 325.0 g of a compound (M-1) and 150.0 g of a compound (M-2) were added thereto and dissolved therein, and, further, 949.6 g of a compound (M-6) and 6.1 g of a compound (M-7) were added, followed by heating to 60° C. Thereafter, 2.2 g of a carbon-supported platinum catalyst (5% by weight) was put into the flask. After it was confirmed that the internal reaction temperature rose to 65° C. to 67° C., the contents of the flask was aged further at 90° C. over three hours, was then cooled to 60° C., 2.2 g of the carbon-supported platinum catalyst (5% by weight) was added thereto, and 107.5 g of a compound (M-5) was added dropwise to the flask over one hour. In this instance, the temperature inside the flask rose to 80° C. After the dropwise addition was over, the contents of the flask was aged further at 90° C. for three hours, was cooled to room temperature, 1,800 g of methyl isobutyl ketone was added thereto, and the reaction solution was filtered under pressure to remove the platinum catalyst. Further, 760 g of pure water was added to the thus obtained solution, followed by stirring, leaving to stand and liquid separation to remove an aqueous layer of a lower layer. The liquid-separating and water-washing operation was repeated six times, to remove trace of acid component in the solution. The solvents in the solution were distilled off, and 900 g of cyclopentanone was added, to obtain a solution of a polymer compound (A-2) having a solid concentration of 60% by weight and containing cyclopentanone as a main solvent. The polymer compound (A-2) had the structure of the following formula, and its Mw was 55,000. Note that the compositional ratios of the repeating units were calculated based on the material amounts of the starting compounds. Besides, m in the following formula is 1 or 40.

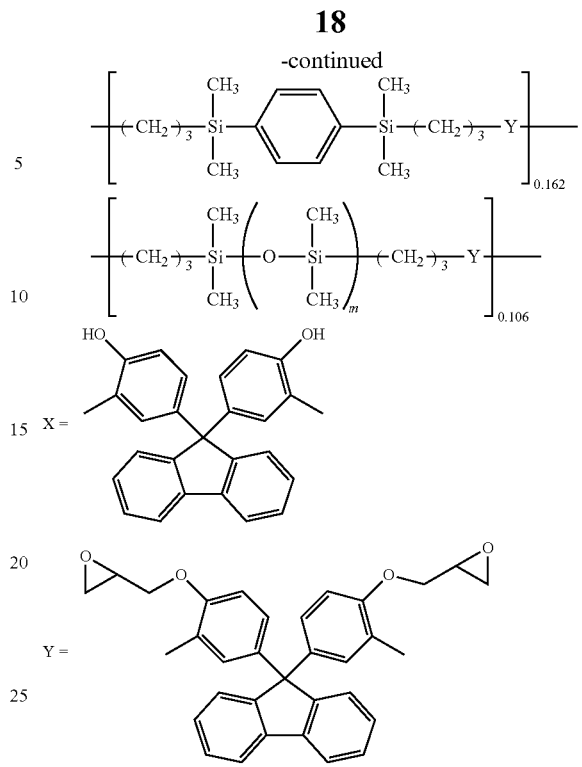

Synthesis Example 3

In a 5 L flask equipped with a stirrer, a thermometer, a nitrogen purge system, and a reflux condenser, 1,875 g of toluene was placed, then 405.0 g of a compound (M-2) and 80.0 g of a compound (M-3) were added thereto and dissolved therein, and, further, 949.6 g of a compound (M-6) and 6.1 g of a compound (M-7) were added, followed by heating to 60° C. Thereafter, 2.2 g of a carbon-supported platinum catalyst (5% by weight) was added. After it was confirmed that the internal reaction temperature rose to 65° C. to 67° C., the contents of the flask was aged further at 90° C. over three hours, was then cooled to 60° C., 2.2 g of the carbon-supported platinum catalyst (5% by weight) was added thereto, and 107.5 g of a compound (M-5) was added dropwise to the flask over one hour. In this instance, the temperature inside the flask rose to 80° C. After the dropwise addition was over, the contents of the flask was aged further at 90° C. for eight hours, was cooled to room temperature, 1,700 g of methyl isobutyl ketone was added thereto, and the reaction solution was filtered under pressure to remove the platinum catalyst. Further, 760 g of pure water was added to the thus obtained solution, followed by stirring, leaving to stand and liquid separation, to remove an aqueous layer of a lower layer. The liquid-separating and water-washing operation was repeated six times, to remove trace of acid component in the solution. The solvents in the solution were distilled off under reduced pressure, and 950 g of cyclopentanone was added, to obtain a solution of a polymer compound (A-3) having a solid concentration of 60% by weight and containing cyclopentanone as a main solvent. The polymer compound (A-3) had the structure of the following formula, and its Mw was 73,000. Note that the compositional ratios of the repeating units were calculated based on the material amounts of the starting compounds. Besides, m in the following formula is 1 or 40.

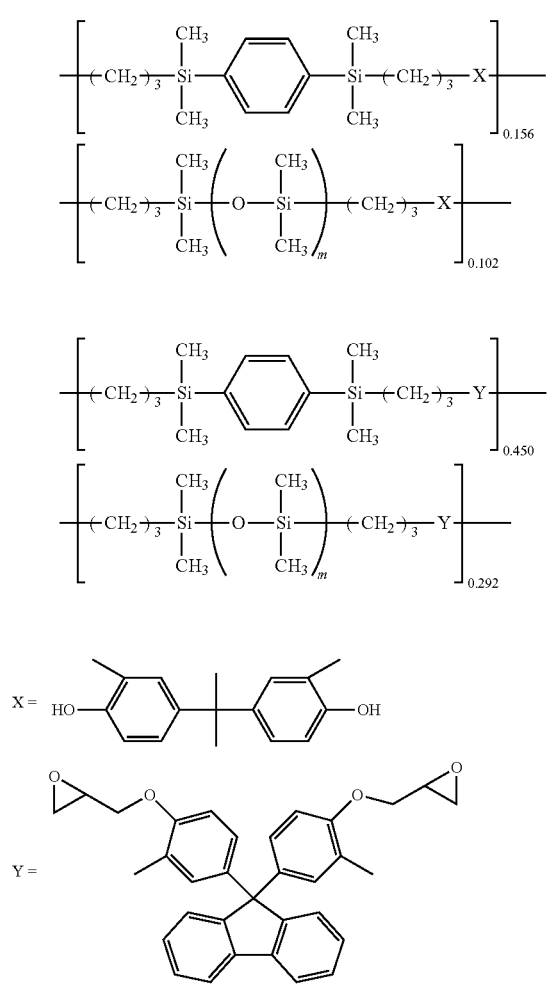

Preparation Examples 1 to 4

Preparation of Resist Composition

A polymer compound, a polyhydric phenol compound, a photo acid generator, a crosslinking agent, a curing accelerator, and a solvent were taken in amounts according to the formulations set forth in Table 1 below, followed by stirring, mixing, and dissolution at normal temperature, and each reaction mixture was subjected to microfiltration using a Teflon®-made 0.2 μm filter, to obtain resist compositions R1 to R4.

The photo acid generators PAG-1 and PAG-2, the crosslinking agent XL-1, and the polyhydric phenol compounds PH-1 to PH-3 in Table 1 are as follows.

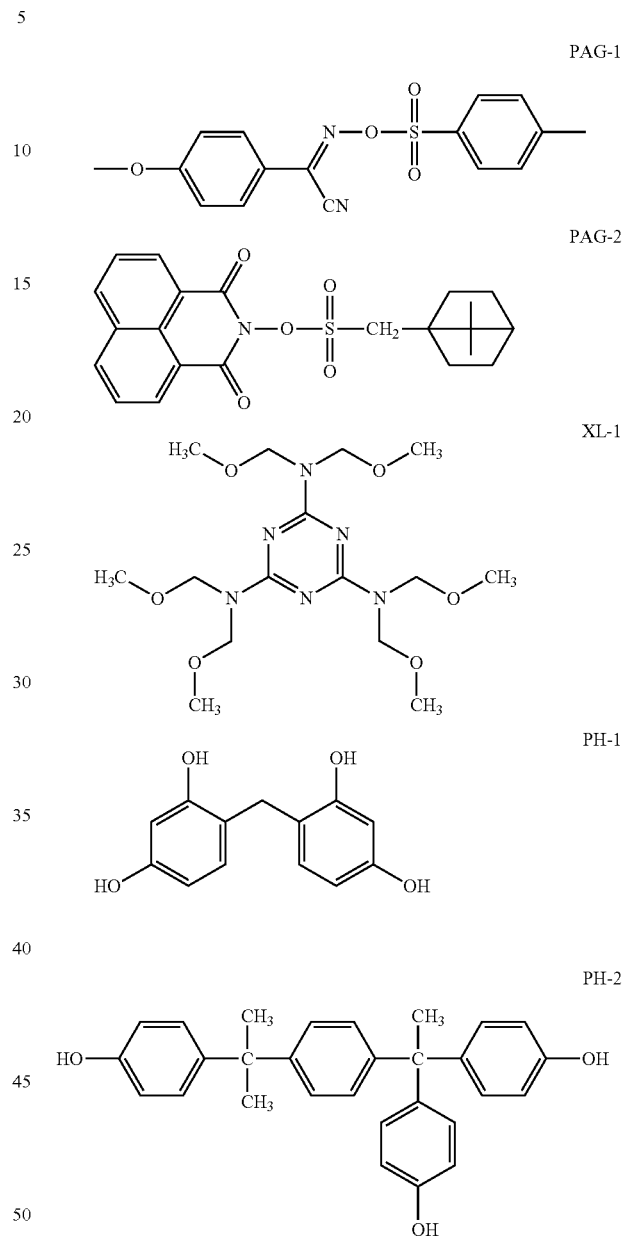

TABLE 1

|  |  | Resist composition | Polymer compound (pbw) | Photo acid generator (pbw) | Crosslinking agent (pbw) | Polyhydric phenol compound (pbw) | Curing accelerator (pbw) | Solvent (pbw) |
| --- | --- | --- | --- | --- | --- | --- | --- | --- |
| Preparation Example | 1 | R1 | A-1 (100) | PAG-2 (2) | XL-1 (15) | PH-1 (15) | U-CAT5002 (0.1) | Cyclopentanone (55) |
|  | 2 | R2 | A-2 (100) | PAG-1 (1) | XL-1 (15) | PH-2 (15) |  | Cyclopentanone (55) |
|  | 3 | R3 | A-3 (100) | PAG-1 (1) | XL-1 (15) | PH-3 (15) |  | Cyclopentanone (55) |
|  | 4 | R4 | A-1 (100) | PAG-1 (1) | XL-1 (15) | PH-1 (15) |  | Cyclopentanone (55) |

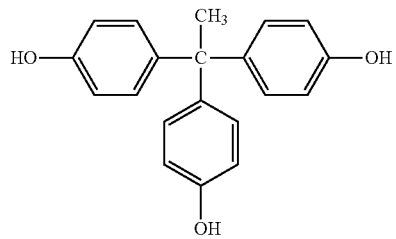

PH-3

Besides, the curing accelerator described in Table 1 is as follows: U-CAT5002 (trade name, DBU tetraphenyl borate salt, made by San-Apro Ltd.).

Preparation Examples 5 to 14

Preparation of Resin Coat Forming Composition

A polymer compound, a basic compound, and a solvent were taken in amounts according to the formulations set forth in Table 2 below, followed by stirring, mixing, and dissolution at normal temperature, and each reaction mixture was subjected to microfiltration using a Teflon®-made 0.2 μm filter, to obtain resin coat forming compositions B1 to B10.

TABLE 2

| | | Resin coat forming composition | Polymer compound (pbw) | Basic compound (pbw) | Solvent (pbw) |
|---|---|---|---|---|---|
| Preparation Example | 5 | B1 | A-1 (99) | AM-1 (1) | Cyclopentanone (55) |
| | 6 | B2 | A-1 (95) | AM-1 (5) | Cyclopentanone (55) |
| | 7 | B3 | A-2 (99.997) | AM-3 (0.003) | Cyclopentanone (55) |
| | 8 | B4 | A-3 (99.95) | AM-1 (0.05) | Cyclopentanone (55) |
| | 9 | B5 | A-3 (99.95) | AM-4 (0.05) | Cyclopentanone (55) |
| | 10 | B6 | A-3 (99.95) | AM-5 (0.05) | Cyclopentanone (55) |
| | 11 | B7 | A-3 (99.95) | AM-6 (0.05) | Cyclopentanone (55) |
| | 12 | B8 | A-3 (99.95) | AM-7 (0.05) | Cyclopentanone (55) |
| | 13 | B9 | A-1 (99.95) | AM-2 (0.05) | Cyclopentanone (55) |
| | 14 | B10 | A-1 (100) | — | Cyclopentanone (55) |

The basic compounds set forth in Table 2 are as follows.

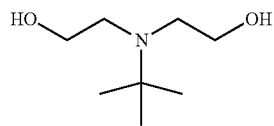

AM-1

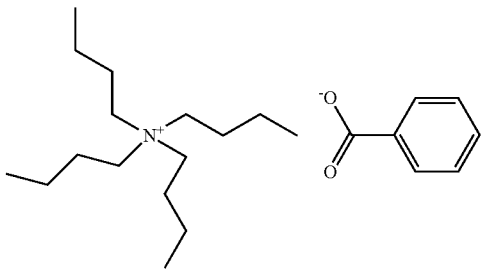

AM-2

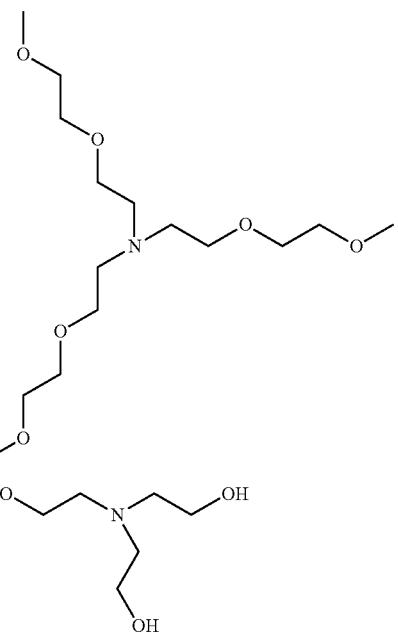

AM-3

AM-4

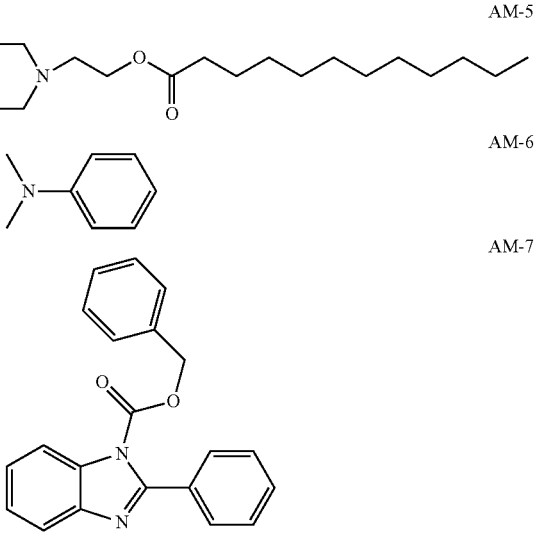

AM-5

AM-6

AM-7

Examples 1 to 9 and Comparative Example 1

Onto a polyethylene terephthalate film (38 μm thick) as a support film, each of the resin coat forming compositions B1 to B10 was applied by a die coater. Then, the composition-coated support film was passed through a hot air circulation oven (4 m in length) set at 100° C. over five minutes, to form a resin coat layer on the support film. The resin coat layer and a polyethylene film (50 μm thick) as a protective film were laminated with each other under a pressure of 1 MPa, to produce films 1 to 9 provided with a basic resin coat layer. The thicknesses of the resin coat layers are depicted in Table 3 below. Note that the thickness was measured by a light interference type thickness measuring instrument (here and hereafter). Note that the light transmittance of the support film was determined by measuring light transmittance at 15 points by a spectrophotometer U-3000 (made by Hitachi, Ltd.), and an average of the measurements was calculated.

TABLE 3

| Film provided with resin coat layer | 1 | 2 | 3 | 4 | 5 | 6 | 7 | 8 | 9 | 10 |
|---|---|---|---|---|---|---|---|---|---|---|
| Resin coat layer forming composition | B1 | B2 | B3 | B4 | B5 | B6 | B7 | B8 | B9 | B10 |
| Basic compound | AM-1 | AM-1 | AM-3 | AM-1 | AM-4 | AM-5 | AM-6 | AM-7 | AM-2 | — |
| Concentration of basic compound (% by weight) | 1 | 5 | 0.003 | 0.05 | 0.05 | 0.05 | 0.05 | 0.05 | 0.05 | 0 |
| Thickness of resin coat layer (μm) | 30 | 15 | 5 | 10 | 10 | 10 | 10 | 10 | 10 | 10 |
| Averaged transmittance of resin film layer to light having wavelength of 300 to 450 nm (%) | 61 | 63 | 85 | 66 | 67 | 69 | 65 | 70 | 68 | 70 |

In addition, films 1 to 4 provided with a chemically amplified negative type resist layer were produced by the same method as above except that the resist compositions R1 to R4 were used in place of the resin coat forming compositions B1 to B10. The thicknesses of the resist layers are depicted in Table 4 below.

TABLE 4

| Film provided with resist layer | 1 | 2 | 3 | 4 |
|---|---|---|---|---|
| Resist composition | R1 | R2 | R3 | R4 |
| Thickness of resist layer (μm) | 50 | 100 | 150 | 100 |

The protective films were peeled off from the film provided with the basic resin coat and the film provided with the resist layer, and lamination was conducted using a roll-to-roll film laminator, to produce each of laminates 1 to 9 of the combinations set forth in Table 5. The support film on the resist layer side of the laminate thus obtained was peeled off, and the resist layer on the support film was put into close contact with a Si substrate, using a vacuum laminator TEAM-100RF (made by Takatori Corporation) and setting a degree of vacuum in a vacuum chamber to 80 Pa. The temperature condition was set at 110° C. After returning to normal pressure, without peeling off the support film on the basic resin coat layer side, the resist layer was exposed at 1,000 mJ/cm² using a contact aligner type exposure system under an exposure condition of 405 nm through a mask for forming a hole pattern of holes of 100 μm in diameter, to form a pattern.

After irradiation with light, the support film was peeled off, PEB at 120° C. was conducted using a hot plate for five minutes, followed by cooling, and the resist layer was developed by spraying PGMEA thereto for 300 seconds. The resist layer formed with the pattern was post-cured using an oven at 180° C. for two hours, with nitrogen purge. The opening pattern shape at the time of pattern formation and the results of pattern formation are set forth in Table 5. The pattern shape was observed under an SEM.

TABLE 5

| | Example | | | | | | | | | Comparative Example |
|---|---|---|---|---|---|---|---|---|---|---|
| | 1 | 2 | 3 | 4 | 5 | 6 | 7 | 8 | 9 | 1 |
| Laminate | Laminate 1 | Laminate 2 | Laminate 3 | Laminate 4 | Laminate 5 | Laminate 6 | Laminate 7 | Laminate 8 | Laminate 9 | Laminate 9 |
| Basic resin coat layer | B1 | B2 | B3 | B4 | B5 | B6 | B7 | B8 | B9 | B10 |
| Resist layer | R1 | R2 | R3 | R4 | R4 | R4 | R4 | R4 | R2 | R4 |
| Thickness of laminate (μm) | 80 | 115 | 155 | 110 | 110 | 110 | 110 | 110 | 100 | 60 |
| Opening pattern shape (Side wall angle: unit °) | Rectangle (87) | Rectangle (85) | Rectangle (90) | Rectangle (89) | Rectangle (88) | Rectangle (89) | Rectangle (87) | Rectangle (89) | Rectangle (89) | T-top |

Japanese Patent Application No. 2016-202352 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A laminate comprising:
a chemically amplified negative type resist layer; and
a basic resin coat layer on the chemically amplified negative type resist layer that contains 0.001 to 10% by weight of a basic compound having a molecular weight of up to 10,000,
wherein the chemically amplified negative type resist layer comprises:
(A) a siloxane skeleton-containing polymer compound having a weight average molecular weight of 3,000 to 500,000 and represented by the following formula (1):

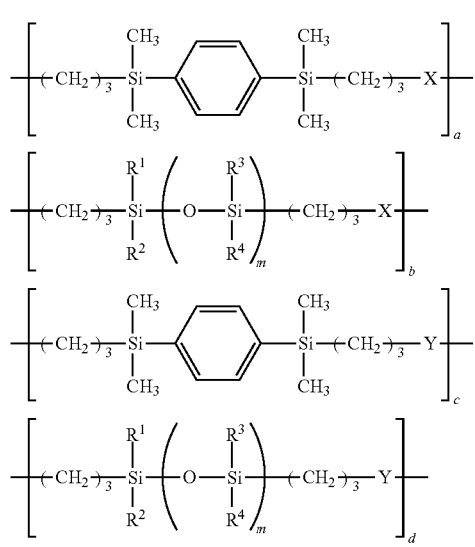

wherein $R^1$ to $R^4$ are each independently a monovalent hydrocarbon group having 1 to 8 carbon atoms, m is an integer of 1 to 100, a, b, c, and d are numbers satisfying $0 \leq a \leq 1$, $0 \leq b \leq 1$, $0 \leq c \leq 1$, $0 \leq d \leq 1$, $0 < a+b \leq 1$, and $a+b+c+d=1$, X is a divalent organic group represented by the following formula (2), Y is a divalent organic group represented by the following formula (3):

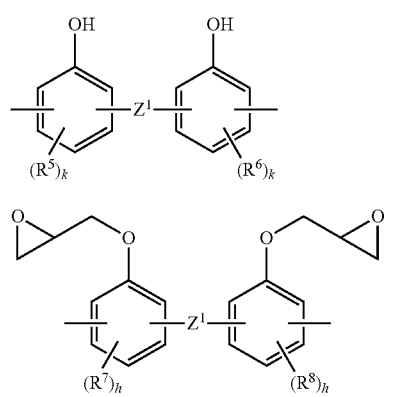

wherein $Z^1$ and $Z^2$ are each independently a single bond or a divalent organic group selected from among the following,

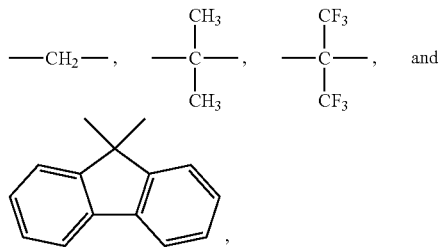

$R^5$ to $R^8$ are each independently an alkyl group or alkoxyl group having 1 to 4 carbon atoms, and k and h are each independently 0, 1 or 2;
(B) a polyhydric phenol compound containing at least three hydroxyl groups;
(C) a photo acid generator that generates an acid by being decomposed by light having a wavelength of 190 to 500 nm; and
(D) at least one crosslinking agent selected from among an amino condensate modified with formaldehyde or formaldehyde-alcohol, a phenol compound containing an average of at least two methylol groups or alkoxymethylol groups in one molecule thereof, and a compound obtained by substituting a hydroxyl group of a polyhydric phenol with a glycidoxyl group, and
wherein the resin coat layer contains at least one resin selected from among epoxy resins, phenolic resins, silicone resins which are siloxane skeleton-containing polymer compounds represented by the formula (1), polyester resins, polyurethane resins, and polyimide resins.

2. The laminate according to claim 1, wherein the resin coat layer is transmissive to light having a wavelength of 190 to 500 nm.

3. A laminate comprising:
a chemically amplified negative type resist layer; and
a basic resin coat layer on the chemically amplified negative type resist layer that contains 0.001 to 10% by weight of a basic compound having a molecular weight of up to 10,000,
wherein the chemically amplified negative type resist layer is formed using a composition comprising:
(A) a siloxane skeleton-containing polymer compound having a weight average molecular weight of 3,000 to 500,000 and represented by the following formula (1):

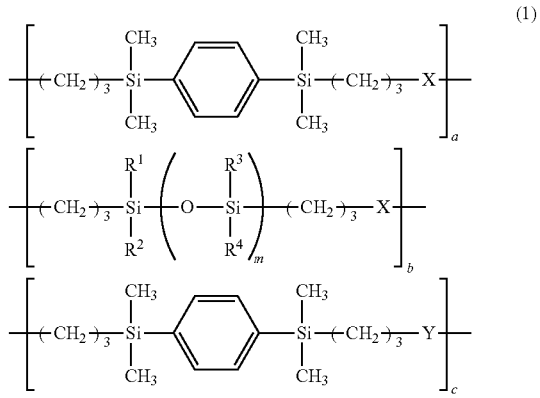

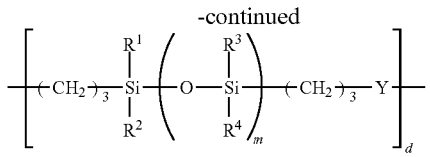

wherein $R^1$ to $R^4$ are each independently a monovalent hydrocarbon group having 1 to 8 carbon atoms, m is an integer of 1 to 100, a, b, c, and d are numbers satisfying $0 \leq a \leq 1$, $0 \leq b \leq 1$, $0 \leq c \leq 1$, $0 \leq d \leq 1$, $0 < a+b \leq 1$, and $a+b+c+d=1$, X is a divalent organic group represented by the following formula (2), Y is a divalent organic group represented by the following formula (3):

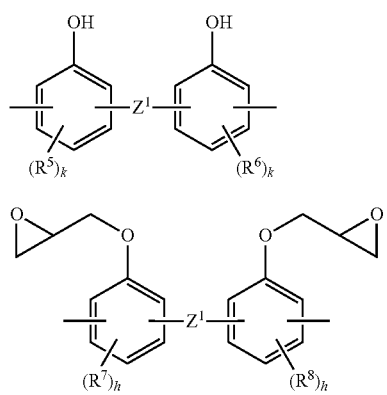

wherein $Z^1$ and $Z^2$ are each independently a single bond or a divalent organic group selected from among the following,

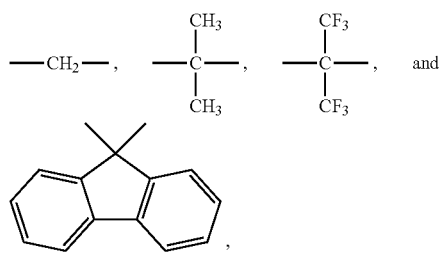

$R^5$ to $R^8$ are each independently an alkyl group or alkoxyl group having 1 to 4 carbon atoms, and k and h are each independently 0, 1 or 2;
(B) a polyhydric phenol compound containing at least three hydroxyl groups;
(C) a photo acid generator that generates an acid by being decomposed by light having a wavelength of 190 to 500 nm;
(D) at least one crosslinking agent selected from among an amino condensate modified with formaldehyde or formaldehyde-alcohol, a phenol compound containing an average of at least two methylol groups or alkoxymethylol groups in one molecule thereof, and a compound obtained by substituting a hydroxyl group of a polyhydric phenol with a glycidoxyl group; and
(G) a solvent, and
wherein the resin coat layer contains at least one resin selected from among epoxy resins, phenolic resins, silicone resins which are siloxane skeleton-containing polymer compounds represented by the formula (1), polyester resins, polyurethane resins, and polyimide resins.

4. A pattern forming method comprising the steps of:
performing exposure by irradiating the chemically amplified negative type resist layer of the laminate according to claim 1 with light;
developing the exposed resist layer; and
heating the developed resist layer.

5. The pattern forming method according to claim 4, wherein a side wall angle of a pattern is 60 to 90 degrees.

6. A laminate comprising:
a chemically amplified negative type resist layer; and
a basic resin coat layer on the chemically amplified negative type resist layer that contains 0.001 to 10% by weight of a basic compound having a molecular weight of up to 10,000,
wherein the chemically amplified negative type resist layer comprises:
(A) a siloxane skeleton-containing polymer compound having a weight average molecular weight of 3,000 to 500,000 and represented by the following formula (1):

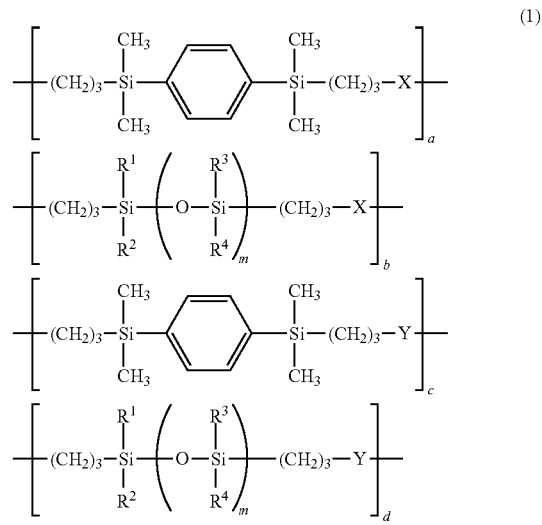

wherein $R^1$ to $R^4$ are each independently a monovalent hydrocarbon group having 1 to 8 carbon atoms, m is an integer of 1 to 100, a, b, c, and d are numbers satisfying $0 \leq a \leq 1$, $0 \leq b \leq 1$, $0 \leq c \leq 1$, $0 \leq d \leq 1$, $0 < a+b \leq 1$, and $a+b+c+d=1$, X is a divalent organic group represented by the following formula (2), Y is a divalent organic group represented by the following formula (3):

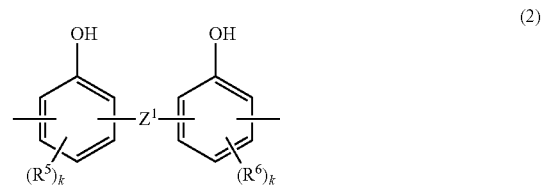

-continued

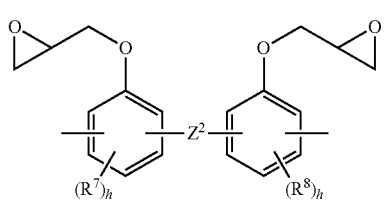
(3)

wherein $Z^1$ and $Z^2$ are each independently a single bond or a divalent organic group selected from among the following,

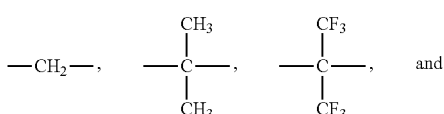
and
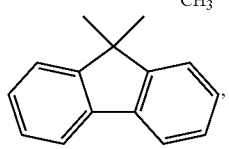

$R^5$ to $R^8$ are each independently an alkyl group or alkoxyl group having 1 to 4 carbon atoms, and k and h are each independently 0, 1 or 2;
  (B) a polyhydric phenol compound containing at least three hydroxyl groups;
  (C) a photo acid generator that generates an acid by being decomposed by light having a wavelength of 190 to 500 nm; and
  (D) at least one crosslinking agent selected from among an amino condensate modified with formaldehyde or formaldehyde-alcohol, a phenol compound containing an average of at least two methylol groups or alkoxymethylol groups in one molecule thereof, and a compound obtained by substituting a hydroxyl group of a polyhydric phenol with a glycidoxyl group, and
wherein the resin coat layer contains at least one resin selected from among epoxy resins, phenolic resins, silicone resins, polyester resins, polyurethane resins, and polyimide resins, and
wherein the thickness of the basic resin coat layer is 1 to 100 μm.

7. A laminate comprising:
a chemically amplified negative type resist layer; and
a basic resin coat layer on the chemically amplified negative type resist layer that contains 0.001 to 10% by weight of a basic compound having a molecular weight of up to 10,000,
wherein the chemically amplified negative type resist layer is formed using a composition comprising:
  (A) a siloxane skeleton-containing polymer compound having a weight average molecular weight of 3,000 to 500,000 and represented by the following formula (1):

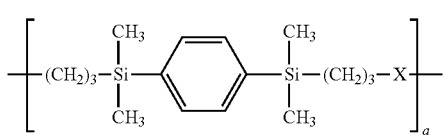
(1)

-continued

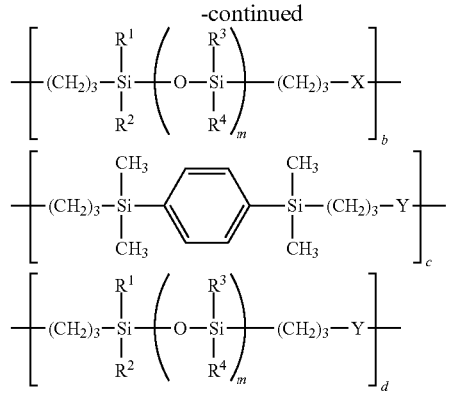

wherein $R^1$ to $R^4$ are each independently a monovalent hydrocarbon group having 1 to 8 carbon atoms, m is an integer of 1 to 100, a, b, c, and d are numbers satisfying 0≤a≤1, 0≤b≤1, 0≤c≤1, 0≤d≤1, 0<a+b≤1, and a+b+c+d=1, X is a divalent organic group represented by the following formula (2), Y is a divalent organic group represented by the following formula (3):

(2)

(3)

wherein $Z^1$ and $Z^2$ are each independently a single bond or a divalent organic group selected from among the following, and $R^5$ to $R^8$ are each independently an alkyl group or alkoxyl group having 1 to 4 carbon atoms, and k and h are each independently 0, 1 or 2;
  (B) a polyhydric phenol compound containing at least three hydroxyl groups;
  (C) a photo acid generator that generates an acid by being decomposed by light having a wavelength of 190 to 500 nm;
  (D) at least one crosslinking agent selected from among an amino condensate modified with formaldehyde or formaldehyde-alcohol, a phenol compound containing an average of at least two methylol groups or alkoxymethylol groups in one molecule thereof, and a compound obtained by substituting a hydroxyl group of a polyhydric phenol with a glycidoxyl group; and
(G) a solvent, and
wherein the resin coat layer contains at least one resin selected from among epoxy resins, phenolic resins, silicone resins, polyester resins, polyurethane resins, and polyimide resins, and
wherein the thickness of the basic resin coat layer is 1 to 100 μm.

* * * * *